(12) United States Patent
Hauer et al.

(10) Patent No.: US 6,456,641 B1
(45) Date of Patent: Sep. 24, 2002

(54) HIGH-FREQUENCY SEMICONDUCTOR LASER MODULE

(75) Inventors: Heiner Hauer, Fellbach; Albrecht Kuke, Auenwald; Eberhard Moess, Murrhard, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/403,905

(22) PCT Filed: Mar. 21, 1998

(86) PCT No.: PCT/DE98/00823

§ 371 (c)(1),
(2), (4) Date: Oct. 27, 1999

(87) PCT Pub. No.: WO98/52255

PCT Pub. Date: Nov. 19, 1998

(30) Foreign Application Priority Data

May 12, 1997 (DE) .......................... 197 19 853

(51) Int. Cl.[7] .................................. H01S 5/00
(52) U.S. Cl. ................... 372/50; 372/34; 372/38.07; 385/14; 219/44
(58) Field of Search .............................. 372/28, 29.015, 372/38.02, 38.07, 109, 43, 44, 50; 385/88–94, 14, 129–132; 216/44

(56) References Cited

U.S. PATENT DOCUMENTS

| | | | | |
|---|---|---|---|---|
| 4,926,545 A | * | 5/1990 | Pimpinella et al. | 29/832 |
| 5,737,458 A | * | 4/1998 | Wojnarowski et al. | 385/15 |
| 6,021,149 A | * | 2/2000 | Miyazaki et al. | 372/50 |
| 6,164,836 A | * | 12/2000 | Yamada et al. | 385/88 |

* cited by examiner

Primary Examiner—Paul Ip
Assistant Examiner—Davienne Monbleau
(74) Attorney, Agent, or Firm—Michael J. Striker

(57) ABSTRACT

The invention is directed to a high-frequency semiconductor laser module with a silicon substrate, especially made of low-impedance silicon, a laser diode arranged thereon, and at least two lines for the H-F feed, one of which is insulated from the silicon substrate by a dielectric layer. According to the invention, the laser diode is arranged on the silicon substrate via a metallic mounting layer, and the H-F line is guided close to the laser diode on the dielectric layer.

12 Claims, 5 Drawing Sheets

HIGH-FREQUENCY SEMICONDUCTOR LASER MODULE

BACKGROUND OF THE INVENTION

The invention is directed to a high-frequency semiconductor laser module according to the preamble of claim 1.

It is known to use semiconductor laser modules for optical communications technology in the high-frequency range of several GHz or Gbits. Driver circuits for the H-F modulation of the semiconductor laser are usually designed in such a way that the hot H-F connection is negative and the ground connection is positive. A H-F modulating current must be conducted from the driver circuit to the laser diode with as little loss as possible. For this purpose, microstrip lines, coplanar lines or grounded coplanar lines are used. These lines require a dielectric carrier which must have a determined thickness and insulating capability depending on the frequency to be transmitted and depending on the dielectric constant of the carrier. In the case of microstrip lines and grounded coplanar lines, the underside of the dielectric carrier is metallized over a large surface area on the underside of the dielectric carrier at least in the area below the line and is connected to ground potential. Microstrip lines have an individual hot conductor path on the upper side of the carrier. In the case of coplanar lines, the hot conductor is enclosed on both sides at a defined distance by ground lines on the upper side of the carrier. In order to prevent losses, an H-F line must be terminated as exactly as possible with its complex characteristic impedance. Usually, H-F lines with a characteristic impedance of 25 Ω, 50 Ω or 75 Ω are used. A laser diode has a complex impedance in the order of 3 Ω. For suitable matching of the termination, an ohmic resistance of corresponding magnitude is connected in series. In so doing, it must be taken into account that any parasitic hypothetical resistance brought about for reasons relating to mounting also contributes to the total complex impedance. Because of the low resistance of the laser diode, bonding wires are especially troublesome due to their inductance, while capacitive resistance components contribute only slightly. A further aspect that must be taken into account with respect to the mounting of the laser diode is adequate dissipation of heat loss. For this reason, a laser diode must be mounted on a carrier having the best possible heat conduction.

In consideration of these technical boundary conditions, a number of construction concepts for high-frequency semiconductor laser modules have been developed according to the prior art. When a laser diode is constructed on a substrate with high insulation accompanied by good heat conduction, e.g., aluminum oxide ceramic, almost all of the above-mentioned boundary conditions can be met. FIG. 1 shows a conventional construction of this kind. The laser chip 1 is mounted on a carrier or substrate 2 which is metallized and textured or structured on its surface and which is made of insulating material with good heat conduction, e.g., aluminum oxide ceramic. This carrier 2 carries the electric H-F feeds 41 and 43 at the same time. The hot conductor of these feeds is formed as a microstrip line with an upper metallization 41 and lower metallization 42 and with the carrier 2 as dielectric intermediate layer. The ground line 43 is at the same potential as the back metallization 42. In this respect, it is disadvantageous that a substrate made of ceramic cannot be structured by micromechanical methods with high-precision guide grooves for the optical components required for light coupling such as microlenses or optical waveguides. On the other hand, micromechanical structuring for guide grooves can easily be accomplished by anisotropic etching technique on single-crystal silicon substrates. An example of this is described in DE 3809396 A1.

Apart from its capacity to be micromechanically structured, a carrier made of silicon has the advantage of a very good heat conductivity of 151 W/(m*K). Therefore, heat losses are conducted very favorably from a laser diode that is soldered directly on the silicon carrier. However, the low specific resistance of the silicon substrate of approximately 700 Ωcm is disadvantageous. Although there does exist high-impedance silicon with a specific resistance of 6 kΩcm, wafers made from this silicon are roughly one hundred times more expensive than normal low-impedance wafers because of the more complicated production process and are therefore not considered for series production. If the electric lines are to be guided on the silicon substrate, at least one of the feed lines must be constructed so as to be insulated from the substrate in order to prevent short circuiting. Polyimide (PI), for instance, is well-suited as an insulating layer for the electric H-F lines. The PI layer must be thick enough that, in the case of coplanar lines, the H-F field between the lines arranged on the upper side of the PI do not reach the silicon lying below. With grounded coplanar lines or microstrip lines, the silicon substrate is shielded by a metallic base layer at ground potential between the PI layer and the silicon substrate. These lines require, as a dielectric, PI which must have a layer thickness of 10 to 20 μm for a frequency range around 5–10 GHz.

SUMMARY OF THE INVENTION

By combining the possibilities known from the prior art for mounting laser diodes on the substrate and for guiding H-F lines, the following two mounting ideas are provided based on silicon as a substrate capable of receiving microstructures:

For example, the laser diode 1 can be arranged on the top of the PI layer 14 (FIG. 2). This would have the advantage that the H-F lines can be guided to the laser diode with low losses. However, due to the fact that the heat conductivity of Pi is inferior to that of silicon by several orders of magnitude, it would not be possible to adequately guide off the heat losses of the laser diode through a PI layer of this thickness.

When the laser diode is placed on a ceramic intermediate carrier 4 which is mounted directly on the silicon substrate 10 (FIG. 3), an adequate dissipation of heat is ensured, but the additional thickness tolerances of the intermediate carrier 4 and its mounting layers negate the advantage of the high positioning accuracy of the microoptical components mounted in the silicon holding structures with respect to the light outlet surface of the laser diode.

It is therefore an object of the present invention to provide a high-frequency semiconductor laser module which avoids the disadvantages of the prior art.

In keeping with these objects, one feature of present invention resides, briefly stated, in a high-frequency semiconductor laser module in which the laser diode is arranged directly on a metallic mounting layer which is located on one side of the silicon substrate, and the two conductors are insulated from one another by the dielectric layer and form the H-F line which is arranged lateral to the laser diode on the same side of the silicone substrate, also via a metallic mounting layer.

The high-frequency semiconductor laser module has the advantage over the prior art that it ensures good heat dissipation from the laser diode and avoids additional high tolerance in mounting the laser, the H-F line, preferably with PI as a dielectric and preferably as microstrip line, coplanar line or grounded coplanar line, is guided close to the laser diode and the laser diode itself is mounted on a metallic laser mounting layer on the silicon substrate.

In many cases, an insulating layer is required between the metallic layer on which the laser diode is mounted and the silicon substrate, as will be explained hereinafter. This insulating layer need not have the thickness that is required for the H-F waveguide because it is located only in the immediate vicinity of the laser diode, so that line losses are only very slight. On the other hand, the insulating layer must have very good heat conduction between the laser mounting layer and the silicon substrate. The insulating layer is advantageously made of silicon nitride and has a thickness between 0.2 $\mu$m and 2 $\mu$m, preferably 1 $\mu$m. Silicon nitride is especially well-suited because it is favorably adapted to the silicon substrate with respect to its thermal expansion ($2.8*10^{-6}K^{-1}$) and also has a sufficient heat conductivity at 25 W/(K*m). In order to improve adhesion, an additional, thinner layer of less than 0.2 $\mu$m can be arranged below this silicon nitride layer. This layer is preferably made of silicon dioxide. Because of its low heat conductivity of only 1.4 W/(m*K), the silicon dioxide layer may not be thicker.

BRIEF DESCRIPTION OF THE DRAWING

The objects, features and advantages of the invention will now be described in more detail with the aid of the following description of the preferred embodiments, with reference to the accompanying figures in which.

DESCRIPTION OF THE PREFERRED EMBODIMENTS

N-doped and p-doped semiconductor substrates are used to produce laser diodes. For this purpose, n-doped semiconductor substrates are preferred because they can be produced with a smaller dislocation density, so that the laser diodes produced thereon have a better yield and better aging behavior than p-doped semiconductor substrates. The laser diode chips can be mounted in such a way that the epitaxial layers with the active laser layer are located either on top (epi-up) or on the bottom (epi-down). The placement of the epitaxial layer and the type of dopant of the semiconductor substrate determine the positions of the cathode and anode of a laser diode. Since the driver circuits for the laser modulation current are usually designed in such a way that the hot conductor is connected to negative potential, the cathode of the laser diode must be connected with the hot conductor. On the other hand, the anode of the laser diode can also be connected to ground potential.

Figure 1:
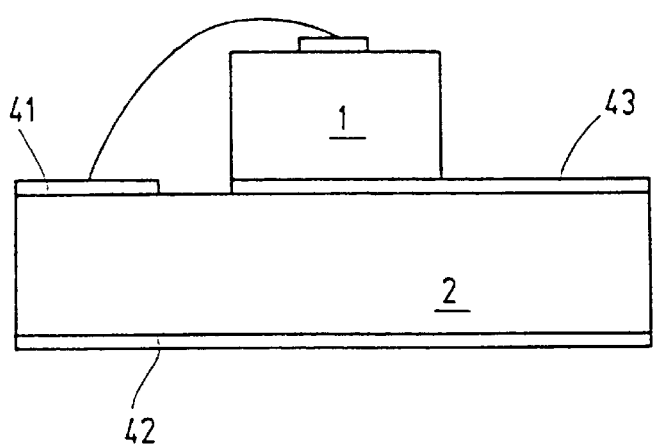
FIG. 1 is a cross-sectional view through a high-frequency laser module according to the prior art.
Figure 2:
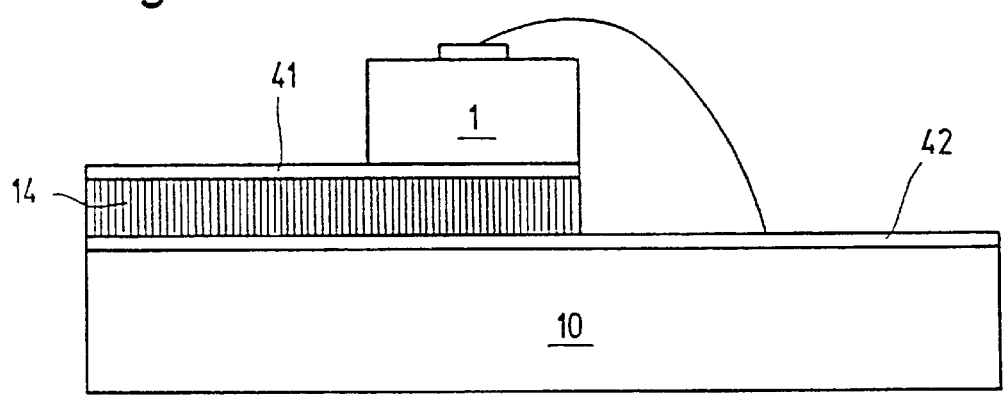
FIGS. 2 and 3 are cross-sectional views through high-frequency laser modules according to respective alternative mounting possibilities.
Figure 3:
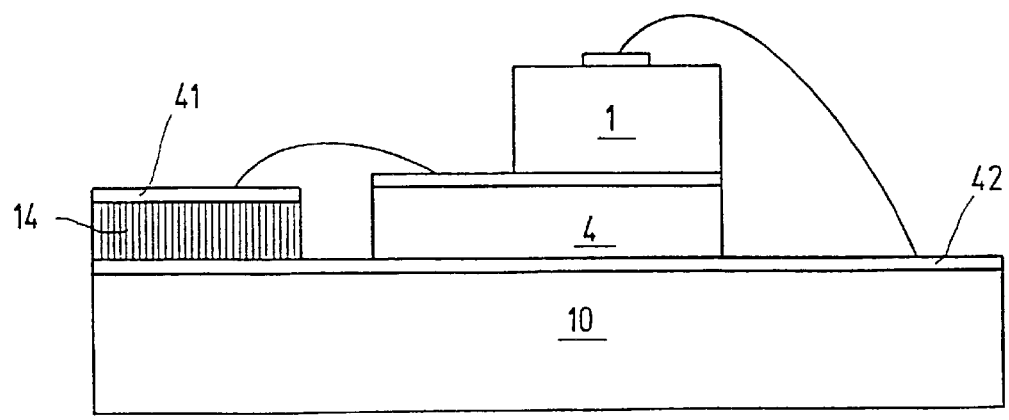
Figure 4A:
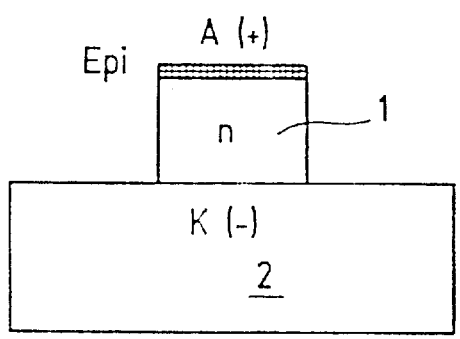
FIGS. 4a to 4d are respective diagrammatic cross-sectional views of a laser diode mounted on a substrate according to a first to fourth embodiment of the high-frequency semiconductor laser module according to the invention.
Figure 4B:
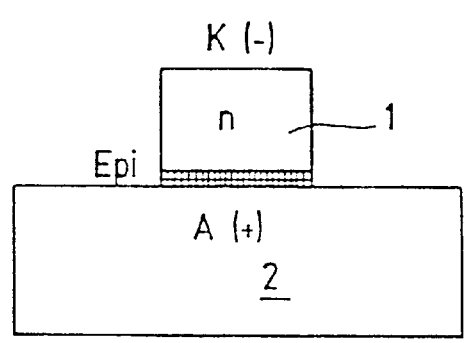
Figure 4C:
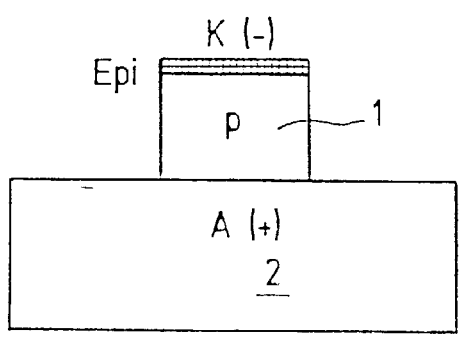
Figure 4D:
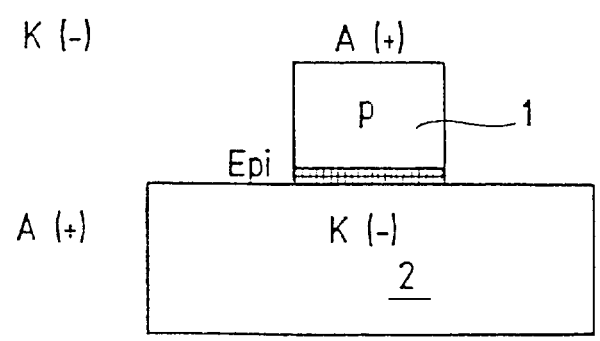

The polarities for a laser diode on an n-doped and p-doped semiconductor substrate with epi-up and epi-down mounting are shown in FIGS. 4a to 4d. FIG. 4a shows a laser diode whose anode is on top of the chip. Only laser diodes in which the anode is arranged on the underside of the chip can be mounted directly on a conductor layer arranged on the silicon substrate. FIG. 4b shows a laser diode of this type with epi-down mounting on an n-semi-conductor substrate and FIG. 4c shows an epi-up mounting on a p-semi-conductor substrate. In FIG. 4a (n-doped semiconductor substrate, epi-up) and FIG. 4d (p-doped semiconductor substrate, epi-down), the insulating intermediate layer according to the invention is used.

FIGS. 5a to 5d show the embodiment examples, according to the invention, for the layer construction and H-F feed with the possible chip/substrate polarity shown in FIGS. 4a to 4d for microstrip H-F line. Alternatively, the two other line types which are known per se, coplanar line and grounded coplanar line, can be used as H-F lines.

Figure 5A:
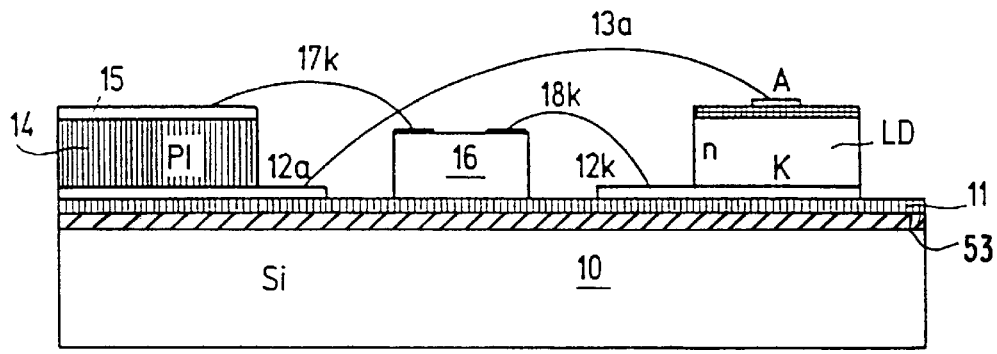
FIGS. 5a to 5d are cross-sectional views through a fifth to eighth embodiment of the high-frequency semiconductor laser module according to the invention.
Figure 5B:
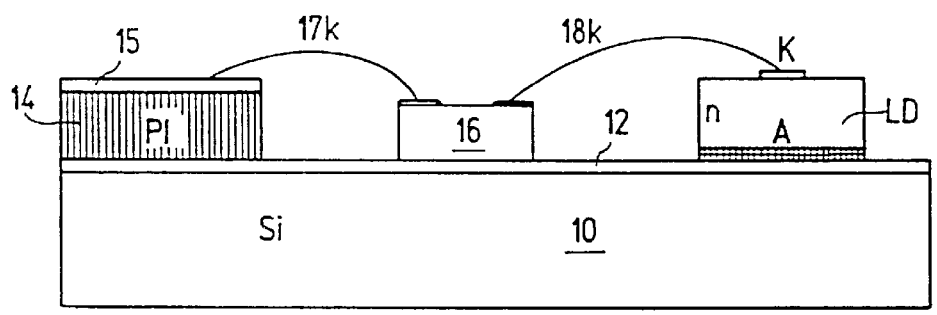
Figure 5C:
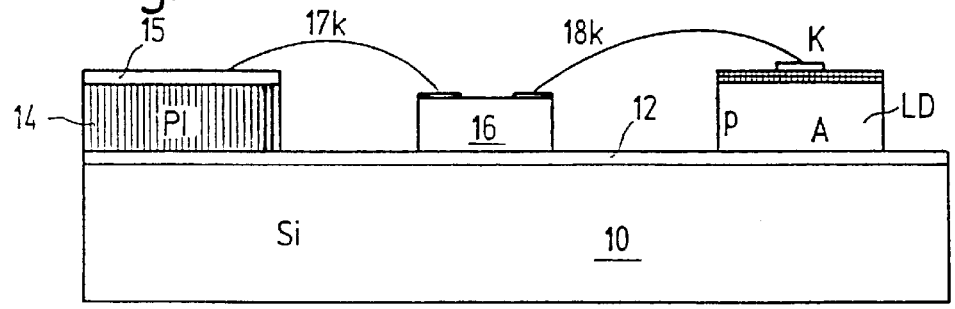
Figure 5D:
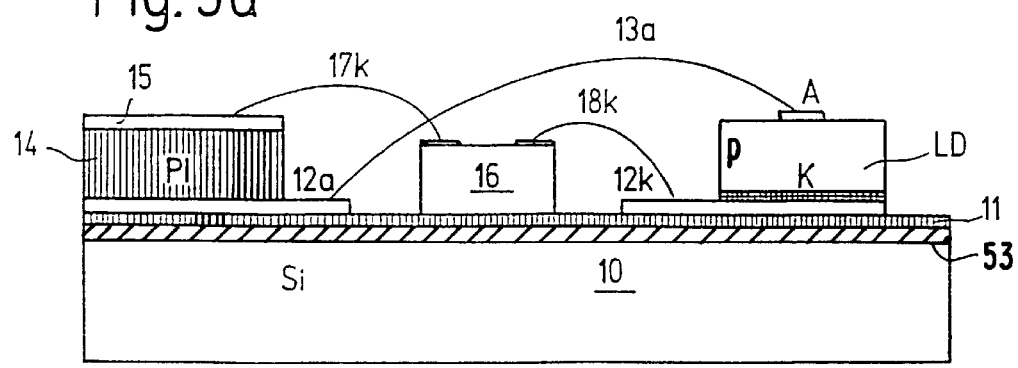

FIGS. 5a and 5d show, respectively, an embodiment example, according to the invention, for a laser diode LD with an n-doped semiconductor substrate and epitaxial layers located on top and for a p-doped semiconductor substrate with epitaxial layers located on the bottom. In both cases, a thin insulating layer 11 with good heat conduction, which is made of silicon nitride with a thickness of 1 $\mu$m, is arranged on a silicon substrate 10. An adhesion-promoting layer 53 can be arranged between the insulating layer 11 and the substrate 10 to improve the adherence of the insulating layer 11 to the substrate. Since the silicon substrate 10 is to be micromechanically structured in order to generate holding grooves, the insulating layer 11 can also be used as an etching mask for the micromechanical structuring. A first conductor layer 12, which is structured in areas 12a and 12k, is located on this insulating layer 11. Area 12a of this conductor layer 12 is connected to ground potential and is connected, via a bonding wire 13a, with the top anode A of the laser diode LD. The laser diode LD is conductively mounted on the area 12k of the conductor layer 12 by its bottom cathode K. A structured PI layer 14 which serves as a dielectric for a H-F waveguide and which typically has a thickness of 10 $\mu$m to 20 $\mu$m is arranged along a portion of area 12a of the conductor layer 12. The hot conductor 15 of the H-F waveguide is structured on this PI layer 14 in a second conductor layer. This hot conductor 15 is connected, by bonding wires 17k and 18k via the terminating resistance 16 connected in series, with the conductor layer 12k on which the cathode K of the laser diode is mounted.

FIGS. 5b and 5c show an embodiment example, respectively, for a laser diode with n-doped semiconductor substrate and epi-down mounting and for a p-doped laser diode and epi-up mounting. An insulating intermediate layer is not required in this case because the anode of the laser diode LD is located on the bottom and is mounted directly on the bottom conductor layer 12, which is connected to ground potential. The conductor layer 12 need not be structured in these embodiment examples. The H-F waveguide comprising a bottom conductor layer 12, a dielectric 14 made of PI with a thickness of 10 to 20 $\mu$m, and a structured upper hot conductor 15 is brought up close to the laser diode LD. The hot conductor 15 is connected, via the termination resistance 16 connected in series with the laser diode and via the bonding wires 17k and 18k, with the top cathode K of the laser diode LD.

In the aforementioned embodiment examples, according to FIGS. 5a to 5d, the H-F waveguide can be brought up close to the laser diode without losses and terminated by a termination resistance 16 which, together with a series resistance of the laser diode LD, must be as great as the characteristic impedance of the H-F waveguide. In the preceding embodiment examples, bonding wires were used to connect the H-F waveguide with the laser diode LD. The inductive resistance component of these bonding wires cannot be compensated by the capacitive resistance components of the laser diode and is therefore disruptive. In order to overcome this disadvantage, two additional embodiment examples, according to the invention, for laser diodes with n-doped and p-doped semiconductor substrates, respectively, and epi-down mounting are suggested in the following. For this purpose, laser diodes having both contacts on the epitaxial side are used. The mounting and electrical contacting are carried out by means of solder bumps.

Figure 6A:
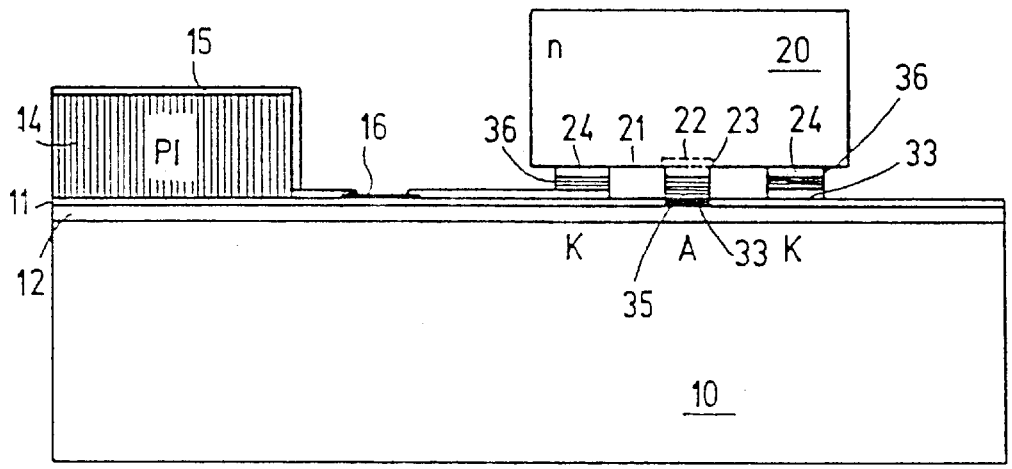
FIGS. 6a to 6c are cross-sectional views through a ninth to eleventh embodiment of the high-frequency semiconductor laser module according to the invention.
Figure 6B:
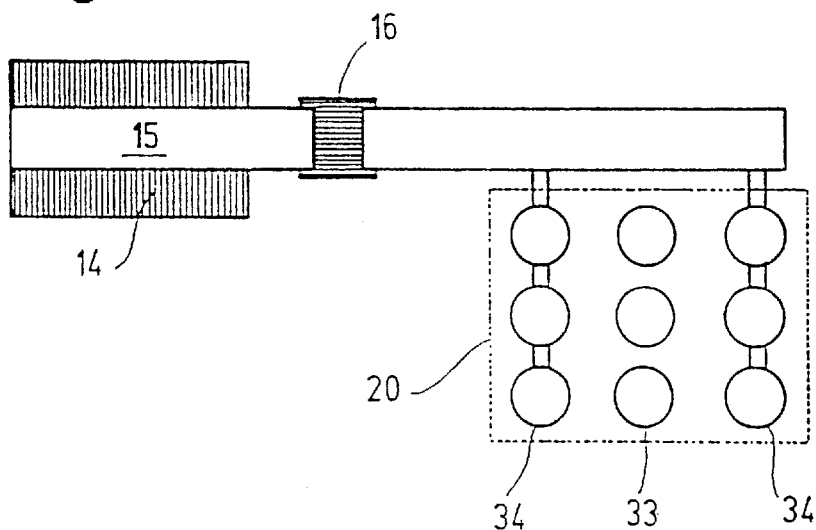
Figure 6C:
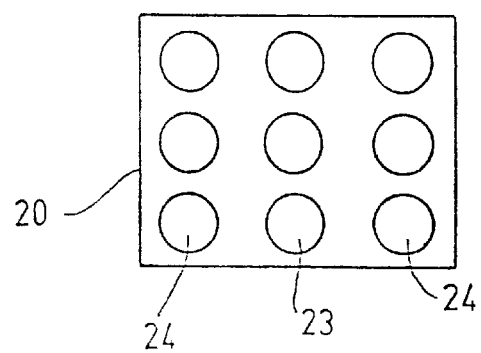

FIG. 6a shows, in cross section, a laser diode 20 with an n-doped semiconductor substrate and a structured epitaxial side 21 facing downward. The anode A lies in the active zone 22 and is provided in that location with contact spots 23. The cathode K is guided out from the semiconductor substrate to the epitaxial side 21 laterally from the active zone 22 and is provided with contact spots 24 at that location. In a mirror-inverted manner with respect to the position of contact spots 23 and 24 on the upper surface 21 of the laser diode 20, complementary contact spots 33 and 34 are arranged at the corresponding locations on the silicon substrate 10. The connection spots determined for the contacting of the anode can be connected to ground potential and do not necessarily require an insulating layer relative to the silicon substrate. The connection spots 34 connected with the hot conductor 15 of the H-F waveguide are electrically insulated from the silicon substrate in the area of the laser diode 20 by the thin insulating layer 11 according to the invention which was described above. The connection spots 33 are connected with the ground metallization 12 on the silicon substrate. Mounting is carried out by the known flip-chip method by means of solder bumps 35 and 36 which serve for mechanical fastening, electrical contacting, lateral orientation and heat dissipation. The bumps can be arranged either on the laser diode (chip bumping) or on the substrate 10 (substrate bumping). The lateral structuring of the layers on the silicon substrate 10 is shown in FIG. 6b. Cutouts 33 are provided in the insulating layer 11 which enable contact with the ground metallization 12 located below it for the contacting of the anode. The hot waveguide 15 lying above the dielectric layer 14 is guided down at the end of the dielectric to the insulating layer 11 and is structured in such a way that the connection spots 34 are formed for the contacting of the cathode. The termination resistance 16 is advantageously integrated as layer resistance in this case. FIG. 6c shows the structuring of the connection spots on the epitaxial side of the laser diode 20. A series of contact spots 23 for the anode are arranged on the active zone 22 of the laser diode 20. One or two rows of connection spots 34 for the cathode are located laterally on one or both sides of these contact spots 23.

Figure 7A:
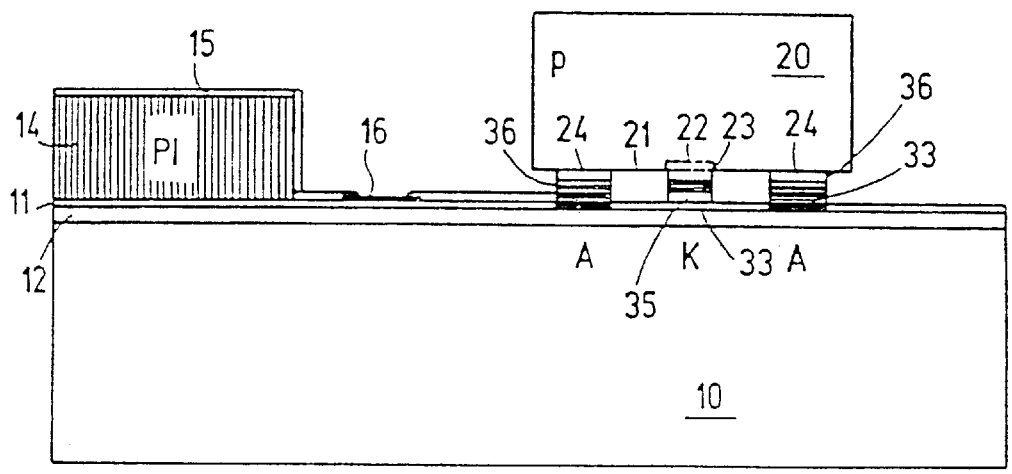
FIGS. 7a to 7c is a cross-sectional view through a twelfth embodiment of the high-frequency semiconductor laser module according to the invention.
Figure 7B:
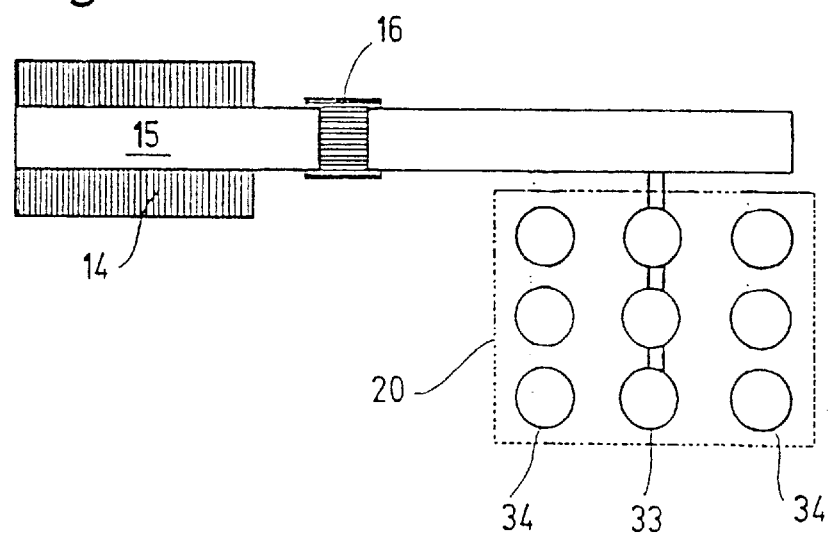
Figure 7C:
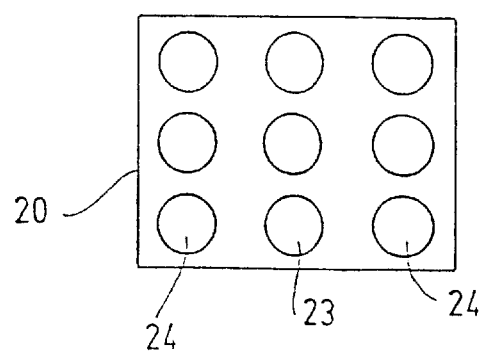

FIG. 7a shows an embodiment example for a laser diode with a p-doped semiconductor substrate 20 with epi-down mounting. In this case, the cathode lies on the active zone. In this case, the hot conductor must be guided to the center of the chip and the contact surfaces for the ground connection of the laser anode are arranged lateral thereto. For this purpose, the conductor geometry of a coplanar waveguide or grounded coplanar waveguide can be guided directly under the laser diode 20 to the contact surfaces. The termination resistance 16 is again integrated as layer resistance.

The last two embodiment examples of the module according to the invention which were described with reference to FIGS. 6a to 6c and 7a to 7c entirely dispense with bonding wires, so that mounting is simplified and, by avoiding bonding wire inductances, an even higher frequency range is made available.

What is claimed is:
1. A high frequency laser module comprising
   a micromechanically structured silicon substrate for mounting optical components thereon, said micromechanically structured silicon substrate being made by etching a silicon substrate with an etching mask;
   a metallic mounting layer arranged on one side of said silicon substrate;
   a laser diode mounted on a region of said metallic mounting layer and in direct electrical contact with said metallic mounting layer;
   high-frequency wiring arranged on said one side of said silicone substrate and spaced from said laser diode in a horizontal direction on said silicone substrate, said high-frequency wiring comprising a ground conductor and a hot conductor separated from each other by a dielectric layer, wherein said metallic mounting layer is structured to form said ground conductor and said region on which said laser diode is mounted, and wherein said region is electrically connected with said hot conductor; and
   an insulating layer sandwiched between said metallic mounting layer for said laser diode and said silicone substrate, said insulating layer being formed to act as said mask for etching the silicon substrate.

2. A high-frequency semiconductor laser module as defined in claim 1, wherein said insulating layer is a silicone nitride layer, whereby said insulating layer has sufficient thermal conductivity and thermal expansion properties compatible with said silicon substrate.

3. A high-frequency semiconductor laser module as defined in claim 2, wherein said silicon nitride layer has a thickness between 0.2 $\mu$m and 2 $\mu$m.

4. A high-frequency semiconductor laser module as defined in claim 2; and further comprising an adhesion-improving layer by which said silicon nitride layer is arranged on said substrate.

5. A high-frequency semiconductor laser module as defined in claim 4, wherein said adhesion-improving layer is a silicon dioxide layer which is thinner than said insulating layer.

6. A high-frequency semiconductor laser module as defined in claim 5, wherein said silicon dioxide layer which forms said adhesion-improving layer has a thickness greater than 0.2 $\mu$m.

7. A high-frequency semiconductor laser module as defined in claim 1, wherein said dielectric layer for insulating said high-frequency wiring is composed of polyamide.

8. A high-frequency semiconductor laser module as defined in claim 1, wherein said high-frequency wiring is a microstrip line.

9. A high-frequency semiconductor laser module as defined in claim 1, wherein said high-frequency wiring is a coplanar line.

10. A high-frequency semiconductor laser module as defined in claim 9, wherein said coplanar line is a grounded coplanar line.

11. A high-frequency semiconductor laser module as defined in claim 1; and further comprising solder bumps which face toward said substrate and wherein said laser diode is connected with said high-frequency wiring via said solder bumps.

12. A high-frequency semiconductor laser module as defined in claim 1, wherein said insulating layer is a thermally conducting layer.

* * * * *